PREPARATION OF PRINTING PLATES

Filed Feb. 10, 1960

INVENTOR
JAMES SAMUEL HAMLIN

BY Lynn Barratt Morris
ATTORNEY

United States Patent Office 3,146,106

Patented Aug. 25, 1964

3,146,106

PREPARATION OF PRINTING PLATES

James Samuel Hamlin, Merchantville, N.J., assignor to E. I. du Pont de Nemours and Company, Wilmington, Del., a corporation of Delaware Filed Feb. 10, 1960, Ser. No. 7,933
10 Claims. (Cl. 96—35)

This invention relates to processes for preparing improved photopolymerized printing elements. More particularly, it relates to processes for preparing photopolymerized printing elements using novel procedures of masking image areas.

Photopolymerizable elements useful for the preparation of printing reliefs are described in Plambeck U.S. Patents 2,760,863 and 2,791,504 and assignee's Martin et al. application, Serial No. 596,766, filed July 9, 1956 (Patent No. 2,927,022, March 1, 1960). The printing reliefs described therein are generally prepared by a single exposure through a process transparency followed by a single washout step. Certain printing elements prepared in this manner, while useful for printing on printing presses, have some disadvantages. It is difficult to form small characters, e.g., periods and fine highlight dots, which have sufficient support at their bases. This is particularly true as the thickness of the photopolymerizable layer is increased, e.g., to a thickness of 30 mils and more. It has been found that, if the exposure is continued until the small characters are insolubilized at the lower surface of the layer (thus improving the base support of the small printing characters), the shadow areas become plugged, and the recesses in some characters, e.g., the center of an "o" or an "e," may become filled. The result is that the printing relief has insufficient depth for a clear, sharp print.

An object of this invention is to provide processes for preparing improved photopolymerized printing elements. Another object is to provide processes for preparing such elements which result in sharp, clean reliefs in finely detailed areas, halftones and fine rulings. A further object is to provide processes for preparing such elements which can be readily practiced by the ordinary technician. Yet another object is to provide processes for preparing such elements which can be used to make line and halftone reliefs simultaneously from a process negative containing line and halftone images. A further object is to provide processes for preparing such elements in which the small characters have improved adherence to the base. Still further objects will be apparent from the following description.

The process of this invention, in its broader aspects, comprises exposing to actinic light a photopolymerizable element having a solid photopolymerizable layer from 3 to 250 mils in thickness comprising (1) a preformed compatible macromolecular polymer binding agent, (2) a non-gaseous, addition-polymerizable ethylenically unsaturated compound containing at least one terminal ethylenic group capable of forming a high polymer by photoinitiated addition polymerization in the presence of an addition polymerization initiator therefor activatable by actinic light, and (3) from 0.0001 to 10% or more by weight, of the layer of such an initiator and, if desired, from 0.001 to 6.0% of a thermal addition polymerization inhibitor, through an image-bearing transparency; characterized by (*a*) exposing said element to about 50% to about 100% of the actinic radiation required for essentially complete addition polymerization in the relief height-forming stratum of said layer, (*b*) covering the finely detailed image areas with a water-impermeable, solvent-developer insoluble masking material, (*c*) washing the unexposed areas of said stratum with a solvent for said binder and for 25% to 84% of the time required for essentially complete removal of the unexposed portion of the stratum, (*d*) removing the masking material and (*e*) washing the resulting element with an aforesaid solvent to remove the remaining unexposed portion of said stratum. In general, the latter step (*e*) will be for 75% to 16% of the time required for essentially complete removal of the unexposed portion of the stratum. The unexposed portions of the layer are removed both in the finely detailed image areas and the other areas to the desired relief height. The two washing steps, in general, remove essentially all of the material in the unexposed areas of the photopolymerizable layer. In some instances, removal takes place down to the base or a layer on the base.

Another embodiment of the invention comprises removing a portion of the unexposed areas from the exposed photopolymerizable layer described above for 16 to 75 percent of the time required for essentially complete removal of the unexposed polymerizable areas, masking the image areas and removing the remainder of the unexposed areas of the photopolymerizable layer for 25 to 84 percent of the time required for essentially complete removal of the unexposed photopolymerizable areas.

To determine the time required for exposure and washout of a photopolymerizable element the following procedure can be utilized. A photopolymerizable element, e.g., having a photopolymerizable layer thickness of 40 mils, is exposed in a stepwise manner, e.g., at 30 second intervals, through a process transparency e.g., a 2-mil highlight 120-line screen, held in intimate contact with the surface of the photopolymerizable element, to an actinic radiation source, e.g., a 6,000-watt carbon arc supported 30 inches from the element surface. The unexposed areas of the layer are essentially removed by spray washing with a dilute alkali solution, e.g., 0.04 N aqueous solution of NaOH. After washing out the unexposed polymer for about 7 to 10 minutes with the alkali solution at 22° C., the printing characters are inspected and the best characters selected. The exposure time is the time of exposure required to give the best characters. It is to be understood, however, that the exposure and washout times will vary with the thickness of the photopolymerizable layer and the photopolymerizable composition used.

In the attached drawing which constitutes a part of this application:

The invention will be further illustrated by, but is not intended to be limited to the following examples.

*Example I*

Figure 1:
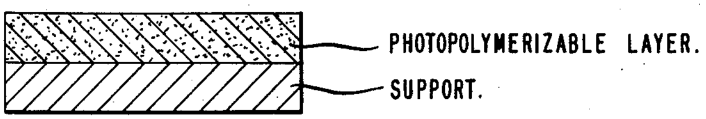
FIGURE 1 shows in cross-section the photopolymerizable element described in Example I.
Figure 2:
FIGURE 2 is an enlarged cross-section of the printing characters B and C made from the element of FIGURE 1.

A photopolymerizable element (FIG. 1) having a polymerizable layer thickness of 40 mils was prepared from 680 g. of cellulose acetate succinate, 320 g. of triethylene glycol diacrylate containing 0.32 g. of anthraquinone, 0.32 g. of p-methoxyphenol, 0.32 g. of mucochloric acid and 6.5 g. of triethylamine as described in Example 3 of assignee's Burg application, Serial No. 750,868, filed July 25, 1958. Four images, A, B, C and D, were formed on the photopolymerizable surface by exposing the photopolymerizable surface through a process negative containing the images in groups, A and D and B and C. The images contained halftone and text areas. The photopolymerizable element, with the process negative placed thereon, was placed in a vacuum frame, and the surface of the photopolymerizable layer was exposed by means of a 1,800-watt high pressure mercury arc to 1.75 watts of actinic radiation per square inch for 9 seconds. Images A and D were then covered to prevent actinic radiation from further exposing the particular images on the photopolymerizable layer, and the exposure of images B and C was continued until the images were exposed to 1.75 watts of actinic radiation per square inch for a total of 18 seconds. The exposed element was removed from the vacuum frame, and the A and D image areas were completely masked out by means of masking tape which adheres firmly to the relief by is impermeable to dilute aqueous NaOH and which extended slightly beyond the image area. The unexposed areas of the photopolymerized layer were removed by spray-washing the element for 6.5 minutes with a 0.04 N aqueous solution of NaOH, the masking tape was removed and the spray washing continued for 3 additional minutes. Images A and D were thus subjected to a 3 minutes washing whereas images B and C were exposed to the washout of 9.5 minutes. Images B and C, which were formed by standard procedure, resulted in printing characters having the character shape illustrated by FIGURE 2. Images A and D had an upper printing portion which had essentially perpendicular sides and a lower portion with rounded-tapered sides similar to the character shape illustrated by FIGURE 5. The resulting printing element was mounted on an 8.5-inch diameter printing cylinder. The halftone area of B cracked during press mounting and essentially all the halftone area of B and C had cracked and lifted from the base support by 225,000 impressions. No failures in images A and D were noted at, at least 500,000 impressions.

*Example II*

1200 grams of cellulose acetate (degree of acetyl substitution 1.85), which had been finely pulverized in a mechanical pulverizer so that the particles could pass through a screen with 0.010 inch openings, was placed in a 60-quart pot of a planetary mixer, the blades of which are operated by an electric motor. To the cellulose acetate was added 890 g. of polyethylene glycol diacrylate (average molecular weight of diol precursor was 300), 0.89 g. of anthraquinone, 520 g. of succinic anhydride and 0.89 g. of p-methoxyphenol and the mixture was mixed for 5 minutes. The mixture was then placed on a preheated two-roll rubber mill internally heated by steam, the rolls of which are smooth cylinders 10 inches in diameter and 20 inches in length and was admixed at 125° C. for 5 minutes. One hundred forty grams of diethylcyclohexylamine was added to the mixture on the mill and was allowed to work into the mixture by milling for 15 minutes at 140 to 150° C. The photopolymerizable sheet prepared on the rubber mill was formed into a clear, transparent sheet, 40 mils thick, by pressing at 170° C. under a pressure of 1,000 pounds per square inch. The pressed sheet was laminated to a sheet of steel by the procedure described in Example 5 of the application of Burg, Serial No. 750,868, filed July 25, 1958. The resultant element was placed in a vacuum frame, and a line-process negative was brought into contact with the polymer surface. A 6,000-watt carbon arc was placed 30 inches from the polymer surface and the photopolymerizable layer was exposed for eight minutes. The photopolymerized element was removed from the vacuum frame, and the image areas were masked with opaque masking tape extending slightly beyond the image areas of which the base portion was to be improved. The surface of the element was spray-washed for 6 minutes with an 0.04 N aqueous solution of NaOH at 24° C. The masking tape was then removed, and the spray washout continued for 2 additional minutes. Satisfactory images with sturdy bases similar to those illustrated by FIGURE 5 were obtained. The printing element was used for printing on a rotary press, satistfactory results comparable to those of Example I being obtained.

*Example III*

Figure 3:
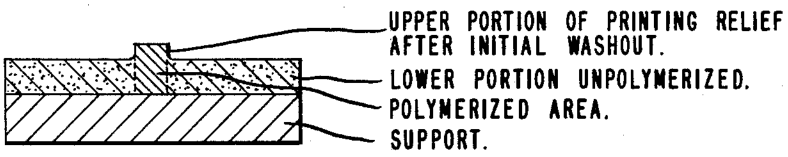
FIGURE 3 is an enlarged cross-section of the printing characters of Example III after exposure and initial washout.
Figure 4:
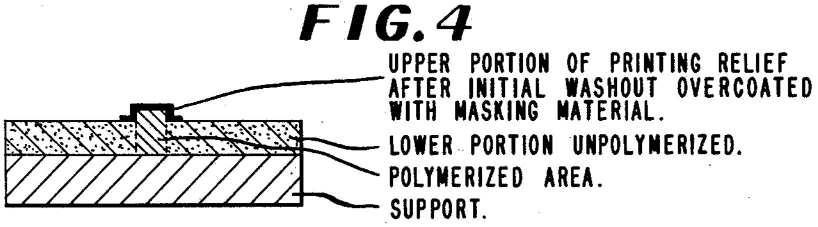
FIGURE 4 is an enlarged cross-section of the masked printing characters of FIGURE 3.
Figure 5:
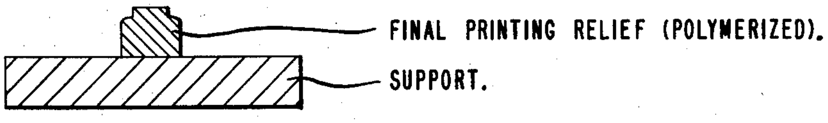
FIGURE 5 is an enlarged cross-section of the printing characters of Example III after final washout.

A photopolymerizable element (FIGURE 1) prepared as described in Example II having a photopolymerizable layer thickness of 40 mils was exposed to the carbon arc for 8 minutes as described in Example II. The photopolymerized element was spray-washed for 2 minutes with an 0.04 N aqueous solution of NaOH at 24° C. (FIGURE 3). The element was washed with water and thoroughly dried. A strippable paint was coated on the image areas requiring a built-up base as illustrated by FIGURE 4 and the coating was allowed to dry. The washout operation was continued for 6 additional minutes, the element surface was dried by blowing with compressed air; the air also removed most of the strippable paint. The remainder of the paint was removed with the adhesive side of the masking tape described in Example I. The printing element which has characters as illustrated by FIGURE 5 was allowed to dry and was used for printing on a rotary press, results comparable to those of the previous examples being obtained.

*Example IV*

A photopolymerizable composition was prepared by placing a mixture consisting of 345 g. of cellulose acetate succinate, 167 g. of triethylene glycol diacrylate, 0.17 g. of anthraquinone and 0.17 g. of p-methoxyphenol on a rubber mill preheated to 105° C. and milling for 22 minutes. The resulting composition was removed from the rubber mill and was pressed at 170° C. to form a photopolymerizable sheet, 40 mils in thickness. The photopolymerizable layer was laminated to a sheet of steel as described in Example II. The photopolymerizable element was exposed to the radiation source described in Example II as described in that Example but for 6 minutes. The element image areas were masked with the tape of Example I as described in that example, and the unexposed areas removed by spray washing for 5 minutes in an 0.04 N aqueous solution of NaOH at 21° C. The masking tape was removed, and the spray washout continued for 5 additional minutes. Satisfactory images with sturdy bases were obtained. The image appearance differed from those of Example II however. The top portion of the printing character had less slope than the characters of Example II and the base portion was closer to the base support than the characters illustrated by FIGURE 5 because of the longer washout period while not masked.

The photopolymerizable layer, 3 to 250 mils in thickness useful in this invention is formed from a photopolymerizable composition which comprises:

(*a*) An organic polymeric binder, 40 to 90 parts by weight, (*b*) An ethylenically unsaturated compound containing 1 to 4 terminal ethylenic groups, having a boiling point above 100° C. at normal atmospheric pressure, a molecular weight of less than 1500 and being capable of forming a high polymer by photoinitiated addition polymerization, 10 to 60 parts by weight, and (*c*) An addition polymerization initiator inactive thermally below 85° C., 0.0001 to 10.0 parts by weight.

In addition to the above constituents the photopolymerizable layer can contain, if desired, (*d*) A thermal polymerization inhibitor, 0.001 to 6.0 parts by weight.

The instant invention is not limited to the particular photopolymerizable composition of the examples. Suitable compositions which can be used are described in Plambeck U.S. Patents 2,760,863 and 2,791,504. Other photopolymerizable compositions which can be used are described in the patents and U.S. applications of assignee as follows:

(1) N-methoxymethyl polyhexamethylene adipamide mixtures of Saner, Ser. No. 577,829, filed April 12, 1956;
(2) Linear polyamide compositions containing extralinear N-acrylyloxymethyl groups of Saner et al., Ser. No. 753,344, filed August 5, 1958;
(3) Polyvinyl acetal compositions having the extralinear vinylidene groups of Martin, Ser. No. 461,291, filed October 8, 1954 (Patent No. 2,929,710, March 22, 1960), and corresponding British Patent 786,119;
(4) Polyester, polyacetal or mixed polyester acetal mixtures of Martin U.S. Patent 2,892,716;
(5) Blends of selected organic-soluble, base-soluble cellulose derivatives with addition-polymerizable components and photoinitiators of Martin et al., Ser. No. 596,766, filed July 9, 1956;
(6) Polyvinyl alcohol derivatives of Martin U.S. Patent 2,902,365;
(7) 1,3-butadiene compositions of McGraw Ser. No. 664,459, filed June 10, 1957, and continuation-in-part Ser. No. 833,928, filed August 17, 1959.

In addition, the following photopolymerizable composition can be used: cellulose acetate (60 parts by weight), triethylene glycol diacrylate (40 parts by weight), anthraquinone (0.1 part by weight), and p-methoxyphenol (0.1 part by weight). If desired, the inert inorganic or organic, filler materials described in Plambeck U.S. Patent 2,760,863 can be added.

Photopolymerizable compositions useful in this invention have been previously described (see above). These compositions comprise addition-polymerizable ethylenically unsaturated compounds, addition-polymerization initiators and preferably thermal, addition polymerization inhibitors.

Suitable addition-polymerizable ethylenically unsaturated compounds, in addition to the preferred triethylene glycol diacrylate and polyethylene glycol diacrylates with an average molecular weight of the diol precursor of 200 to 600, include vinylidene monomers, particularly the vinyl monomers described in Plambeck U.S. Patent 2,791,504, col. 17, line 62, to col. 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$HOCH_2CH_2OCH_2CH_2O{-}OCRCOOCH_2CH_2OCH_2CH_2OH$$

where R is a divalent hydrocarbon radical, e.g., methylene or ethylene. Other useful vinyl monomers include glycerol triacrylate, 1,2-butanetriol trimethacrylate and pentaerythritol tetramethacrylate.

An addition polymerization initiator activatable by actinic radiation and which is inactive thermally below 85° C. is added in amount of from 0.0001 to 10 parts by weight, preferably 0.001 to 0.2 part by weight. Examples of initiators inactive thermally at 85° C. and below are vicinal ketaldonyl compounds such as diacetyl, benzil, etc., α-ketaldonyl alcohols such as benzoin, pivaloin, etc., acyloin ethers such as benzoin methyl or ethyl ethers, alphahydrocarbon substituted aromatic acyloins including α-methylbenzoin, α-allylbenzoin and α-phenylbenzoin.

Preferably, however, the photoinitiators are thermally inactive below 185° C. The anthraquinone photoinitiators fall within this range. In addition to anthraquinone other suitable initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 1,2-benzanthraquinone, 2-3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10 - tetrahydronaphthacenequinone, and 1,2,3,4-tetrahydrobenz[a]anthracene-7,12-dione.

A thermal polymerization inhibitor is present in the preferred composition. Suitable thermal polymerization inhibitors that can be used in addition to the preferred p-methoxyphenol include hydroquinone and alkyl and aryl-substituted hydroquinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

The above-described photopolymerizable compositions are used to prepare photopolymerizable printing elements comprising an adherent support having superposed thereon a solid layer of the photopolymerizable composition from 3 to 250 mils in thickness. The thickness of the photopolymerizable layers vary according to the use. Thickness ranges are disclosed in Plambeck U.S. Patent 2,791,504, col. 3, lines 17 to 25.

The base or support for the photopolymerizable elements of this invention are preferably flexible and composed of metal, e.g., aluminum or steel, but they can be rigid. They also can be made of various film-forming resins or polymers. Suitable supports are disclosed in U.S. Patent 2,760,863, col. 5, lines 14 to 33. Various anchor layers, as disclosed in this patent, may be used to give strong adherence between the base and the photopolymerizable layer. The adhesive compositions disclosed in assignee's U.S. application of Burg, Serial No. 750,868, filed July 25, 1958, are also very effective.

An antihalation material can be present in the support, or in a layer or stratum on the surface of the support, or can be contained in the anchor layer. With transparent or translucent supports, the antihalation material may be on the rear surface of the element. When antihalation material is used it preferably should be sufficiently absorptive of actinic light to permit reflectance from the support or combined support of no more than 35% of incident actinic light.

To form the relief printing elements, the photopolymerizable printing element is exposed to actinic radiation through a process transparency, e.g., a process negative or positive (an image-bearing transparency consisting solely of substantially opaque and substantially transparent areas where the opaque areas are substantially of the same optical density, the so-called line or halftone negative or positive).

The time of exposure must be at least 50 percent of the time required for essentially complete polymerization of the photopolymerizable layer in the exposed areas. The shorter exposure times are possible when the masking procedure is used because the lower portions of the images, which normally are underexposed when less than 100% exposure is used, are protected by the masking material. The shorter exposure period, however, does prevent the image reliefs from being as hard as they would be if the full exposure time was utilized. The problem is not serious because the polymerized surface can be post-exposed after the unpolymerized areas have been removed.

The exposure can be accomplished by using a point or a broad actinic radiation source. The radiation source should furnish an effective amount of ultraviolet radiation since free-radical-generating addition-polymerization initiators activatable by actinic radiation generally exhibit their maximum sensitivity in this range. Suitable sources include carbon arcs, mercury-vapor arcs, fluorescent lamps with special ultraviolet-radiation-emitting phosphors, argon glow lamps and photographic flood lamps. The point sources, e.g., carbon arc, etc, are generally used at distances of 15 to about 40 inches from the photopolymerizable element. Broad radiation sources can be used at a distance up to 24 inches from the photopolymerizable surface. The distance may vary, however, depending on the strength of the radiation source and the time required for exposure.

After the exposure step, the photopolymerized element is either masked in the fine line, halftone or small text image areas where it is desired to have a stronger base or the unpolymerized areas are washed out for a predetermined period and then these image areas are masked. Large text areas generally do not have to be masked out because these areas possess adequate adhesion to the base. When the image areas are masked, the masking material should extend slightly beyond the image area (see FIGURE 4).

Suitable masking materials consist of opaque or transparent masking tape, strippable paint, and other masking materials which are not permeable in aqueous or solvent solutions and whose adhesive properties are not affected by the washout solutions. Masking tapes of the pressure-sensitive type are available commercially, being made by Minnesota Mining & Mfg. Co., St. Paul, Minn. Pressure-sensitive tape #250, "Flatback" having an opaque backing, and #473 having a transparent film backing, and made by this company, give excellent results.

Suitable aqueous washout solutions for the preferred photopolymerizable composition comprising cellulose acetate succinate as the organic polymeric binder include preferably alkali metal hydroxides, e.g., sodium and potassium, and in addition, ammonium, ammonium-substituted hydroxides and the basic reacting salts of the alkali metal hydroxides, especially those of weak acids, e.g., the carbonates, bicarbonates and acetates. Generally the base will be present in concentrations ranging from about 0.01 to about 10 percent, although normally solutions greater than about 5 percent will not be used. The washout solution may be applied in any conventional manner, as by pouring, immersion, splashing with paddles and brushing or spraying in removing the unpolymerized areas. Suitable solvents for the other photopolymerizable compositions which are useful in the present invention can be found in the respective patents or applications listed above.

The printing reliefs made in accordance with this invention can be used in all classes of printing but are most applicable to those classes of printing where in a distinct difference of height between printing and non-printing areas is required. These classes include those wherein the ink is carried by the raised portion of the relief such as in dry-offset printing and ordinary letterpress printing, the latter requiring greater height differences between printing and non-printing areas and those wherein the ink is carried by the recessed portions of the relief such as in intaglio printing, e.g., line and inverted halftone. The plates are useful for multicolor printing.

An advantage of this invention is that it provides a simple and dependable means for preparing photopolymerized printing elements having strongly supported isolated periods, fine lines and edges of halftones. A further advantage is that the printing element prepared by this invention securely holds the small high light dots with no plugging of the shadow areas. An additional advantage is that the printing element prepared by this invention possesses good flexibility and resiliency properties and can be used on standard rotary printing cylinders without the photopolymerized layer cracking. It is believed that the improved flexibility and resiliency obtained is due to the shorter exposure period which results in a small amount of soft polymer remaining after washout at the base of the printing relief characters.

I claim:

1. A process for preparing printing reliefs which comprises exposing to actinic light a photopolymerizable element having a solid photopolymerizable layer from 3 to 250 mils in thickness comprising (1) a preformed compatible macromolecular polymer binding agent, (2) a non-gaseous, addition-polymerizable ethylenically unsaturated compound containing at least one terminal ethylenic group capable of forming a high polymer by photoinitiated addition polymerization in the presence of an addition polymerization initiator therefor activatable by actinic light, and (3) from 0.0001 to 10%, by weight, of the layer of such an initiator through an image-bearing transparency and washing the exposed element to form a relief image; characterized by (*a*) exposing said element to about 50% to about 100% of the actinic radiation required for essentially complete addition polymerization in the relief height-forming stratum of said layer, (*b*) covering the finely detailed image areas with a water-impermeable, solvent-developer insoluble masking material, (*c*) washing said stratum containing unexposed areas with a solvent for said binder and for 25% to 84% of the time required for essentially complete removal of the unexposed portion of the stratum, (*d*) removing the masking material and (*e*) washing the resulting element with an aforesaid solvent to remove the remaining unexposed portion of said stratum.

2. A process as defined in claim 7 wherein said layer contains 0.001% to 6.0% by weight of a thermal addition polymerization inhibitor.

3. A process as defined in claim 7 wherein antihalation material is present beneath the photopolymerizable layer.

4. A process as defined in claim 7 wherein said initiator is thermally inactive below 85° C.

5. A process as defined in claim 7 wherein said initiator is thermally inactive below 185° C.

6. A process as defined in claim 7 wherein a dilute aqueous solution of sodium hydroxide is used as the solvent.

7. A process for preparing printing reliefs which comprises exposing to actinic light a photopolymerizable element having a solid photopolymerizable layer from 3 to 250 mils in thickness comprising (1) a preformed compatible macromolecular polymer binding agent, (2) a non-gaseous, addition-polymerizable ethylenically unsaturated compound containing at least one terminal ethylenic group capable of forming a high-polymer by photoinitiated addition polymerization in the presence of an addition polymerization initiator therefor activatable by actinic light, and (3) from 0.0001 to 10%, by weight, of the layer of such an initiator through an image-bearing transparency and washing the exposed element to form a printing relief; characterized by exposing said element to about 50% to about 100% of the actinic radiation required for essentially complete addition polymerization in the relief height-forming stratum of said layer, and washing the exposed element with a solvent for said binder both while the finely detailed areas of the image in the exposed element are covered with a water-impermeable, solvent-developer-insoluble masking material and in the absence of the masking material, the washing step during which the masking material is present being continued for 25% to 84% of the period of time required for essentially complete removal of the unexposed portion of the stratum and the other washing step being for 16% to 75% of said period, and removing the mask after said masked washing period.

8. A process for preparing printing reliefs which comprises exposing to actinic light a photopolymerizable element having a solid photopolymerizable layer from 3 to 250 mils in thickness comprising (1) a preformed compatible macromolecular polymer binding agent, (2) a non-gaseous, addition-polymerizable ethylenically unsaturated compound containing at least one terminal ethylenic group capable of forming a high polymer by photoinitiated addition polymerization in the presence of an addition polymerization initiator therefor activatable by actinic light, and (3) from 0.0001 to 10%, by weight, of the layer of such an initiator through an image-bearing transparency and washing the exposed element to form a printing relief; characterized by (*a*) exposing said element to about 50% to about 100% of the actinic radiation required for essentially complete addition polymerization in the relief height-forming stratum of said layer, (*b'*) washing said stratum containing unexposed areas with a solvent for said binder and for 16% to 75% of the time required for essentially complete removal of the unexposed portion of the stratum, (*c'*) covering the finely detailed image areas with a water-impermeable, solvent-developer insoluble masking material, (*d'*) washing the resulting element with an aforesaid solvent for 25% to 8% of the time required for essentially complete removal of the unexposed portion of said stratum, and (*e'*) removing the masking material.

9. A process according to claim 7 wherein said masking material is a masking tape.

10. A process according to claim 8 wherein said masking material is a masking tape.

References Cited in the file of this patent

UNITED STATES PATENTS

| | | |
|---|---|---|
| 2,927,022 | Martin et al. | Mar. 1, 1960 |
| 2,927,023 | Martin | Mar. 1, 1960 |
| 2,993,789 | Crawford | July 25, 1961 |

OTHER REFERENCES

Mertle et al.: Photomechanics and Printing, Mertle Publishing Company; Chicago, Ill., 1957, pp. 159–160. (Note last paragraph under "Albumen Process.")